(12) United States Patent
Wang et al.

(10) Patent No.: US 10,304,891 B2
(45) Date of Patent: May 28, 2019

(54) BACKSIDE METAL GRID AND METAL PAD SIMPLIFICATION

(71) Applicant: OmniVision Technologies, Inc., Santa Clara, CA (US)

(72) Inventors: Qin Wang, San Jose, CA (US); Gang Chen, San Jose, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/873,743

(22) Filed: Jan. 17, 2018

(65) Prior Publication Data

US 2018/0182803 A1 Jun. 28, 2018

Related U.S. Application Data

(62) Division of application No. 15/388,888, filed on Dec. 22, 2016, now Pat. No. 9,911,780.

(51) Int. Cl.
*H01L 27/146* (2006.01)
*H01L 31/18* (2006.01)

(52) U.S. Cl.
CPC .. *H01L 27/14636* (2013.01); *H01L 27/14629* (2013.01); *H01L 27/14643* (2013.01); *H01L 27/14685* (2013.01); *H01L 27/14689* (2013.01); *H01L 31/18* (2013.01)

(58) Field of Classification Search
CPC ......... H01L 27/14636; H01L 27/14629; H01L 27/14685; H01L 27/14689; H01L 27/18; H01L 27/14643
See application file for complete search history.

(56) References Cited

U.S. PATENT DOCUMENTS

| | | |
|---|---|---|
| 9,184,206 B1 | 11/2015 | Zheng et al. |
| 9,691,811 B1 | 6/2017 | Borthakur |
| 9,991,303 B2 | 6/2018 | Hsu et al. |
| 2010/0238331 A1* | 9/2010 | Umebayashi ..... H01L 27/14632 348/294 |

(Continued)

OTHER PUBLICATIONS

"Refractive Index of HfO2, Hafnium Oxide" available online at https://www.filmetrics.com/refractive-index-database/HfO2/Hafnium-Oxide as of Mar. 29, 2018.*

(Continued)

*Primary Examiner* — Matthew C Landau
*Assistant Examiner* — Grant S Withers
(74) *Attorney, Agent, or Firm* — Christensen O'Connor Johnson Kindness PLLC

(57) ABSTRACT

An image sensor includes a semiconductor material including a plurality of photodiodes disposed in the semiconductor material. The image sensor also includes a first insulating material disposed proximate to a frontside of the semiconductor material, and an interconnect disposed in the first insulating material proximate to the frontside of the semiconductor material. A metal pad extends from a backside of the semiconductor material through the first insulating material and contacts the interconnect. A metal grid is disposed proximate to the backside of the semiconductor material, and the semiconductor material is disposed between the metal grid and the first insulating material disposed proximate to the frontside.

17 Claims, 3 Drawing Sheets

(56) References Cited

U.S. PATENT DOCUMENTS

| | | |
|---|---|---|
| 2012/0001286 A1 | 1/2012 | Yoon |
| 2012/0061789 A1 | 3/2012 | Yang et al. |
| 2012/0153419 A1* | 6/2012 | Itonaga ............. H01L 21/76898 257/432 |
| 2013/0020468 A1* | 1/2013 | Mitsuhashi ....... H01L 27/14627 250/208.1 |
| 2013/0221465 A1* | 8/2013 | Kim .................. H01L 27/14636 257/432 |
| 2017/0104019 A1 | 4/2017 | Jung |
| 2017/0221943 A1* | 8/2017 | Yamazaki ......... H01L 27/14603 |

OTHER PUBLICATIONS

"Refractive Index of Si3N4, Silicon Nitride, SiN, SiON" available online at https://www.filmetrics.com/refractive-index-database/Si3N4/Silicon-Nitride-SiN as of Mar. 29, 2018.*

Hernandez, J. et al., "Chemical Mechanical Polishing of Al and SiO2 Thin Films: The Role of Consumables", Journal of the Electrochemical Society, 1999, vol. 146, Issue 12, pp. 4647-4653, © The Electrochemical Society, Inc. doi: 10.1149/1.1392688.

Taiwanese Office Action and Translation dated Oct. 19, 2018, for Taiwanese Application No. 106145002, filed Dec. 21, 2017, 15 pages.

* cited by examiner

BACKSIDE METAL GRID AND METAL PAD SIMPLIFICATION

REFERENCE TO RELATED APPLICATION

This application is a divisional of U.S. application Ser. No. 15/388,888, filed on Dec. 22, 2016, the contents of which are incorporated herein by reference.

TECHNICAL FIELD

This disclosure relates generally to semiconductor fabrication, and in particular but not exclusively, relates to metal grid fabrication.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

To differentiate between colors image sensors may use color filters. Color filters filter incident light on the image sensor by wavelength range, so that each photodiode in the image sensor only receives image light in a particular wavelength range. The raw data captured by the image sensor is converted into a full color image by a demosaicing algorithm which is tailored for the various color filters.

While there are a variety of ways to make color image sensors, reducing the number of steps in semiconductor processing applications is always important. Since every fabrication step adds cost and time on the assembly line, new techniques to enhance image senor throughput are needed.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
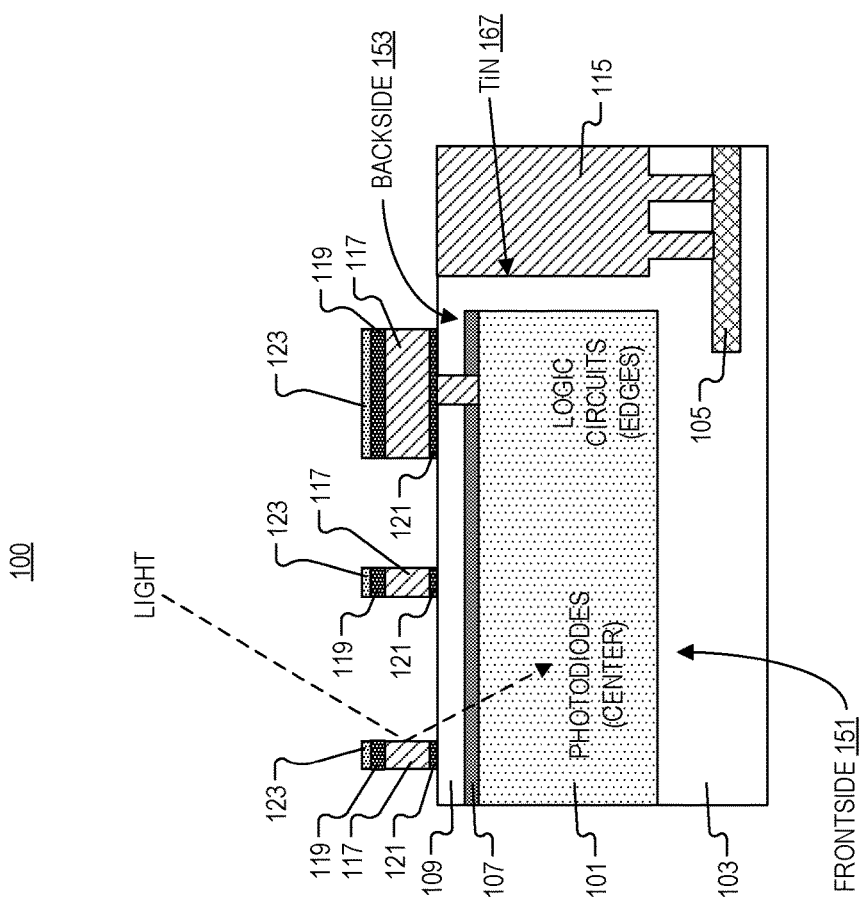
FIG. 1 illustrates a cross section of a partially competed image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for backside metal grid and metal pad simplification are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates a cross section of a partially competed image sensor 100. Image sensor 100 includes semiconductor material 101 (with frontside 151 and backside 153), first insulating material 103, second insulating material 109, high-k oxide 107, interconnect 105, metal pad 115, metal grid 117, protective layers 119/121, and antireflection coating 123.

Semiconductor material 101 includes a plurality of photodiodes disposed in semiconductor material 101 (see e.g., FIG. 3), and first insulating material 103 is disposed proximate to frontside 151 of semiconductor material 101. In the depicted example, the photodiodes may be disposed proximate to the center of semiconductor material 101, while logic circuits may be disposed on the edges of semiconductor material 101 (e.g., Si wafer). Interconnect 105 is disposed in first insulating material 103 proximate to frontside 151 of semiconductor material 101. Metal pad 115 extends from backside 153 of semiconductor material 101 through first insulating material 103 and contacts interconnect 105. As shown, one or more trenches extend through first insulating material 103 to connect metal pad 115 to interconnect 105. Also a majority of metal pad 115 may be disposed proximate to a planar edge of semiconductor material 101. In one example, metal pad 115 includes aluminum, and interconnect 105 includes copper, and in another or the same example, TiN liner 167 may be deposited at the metal interface to cover the whole trench. One of ordinary skill in the art will appreciate that frontside 151 is the side of image sensor 100 with circuitry (e.g., interconnect 105), and frontside 151 is opposite the backside 153. Metal grid 117 is disposed proximate to backside 153 of semiconductor material 101, and semiconductor material 101 is disposed between metal grid 117 and first insulating material 103.

In the illustrated example, second insulating material 109 and high-k oxide 107 are disposed between semiconductor material 101 and metal grid 117 on backside 153 of image sensor 100. As depicted, high-k oxide 107 may be disposed between second insulating material 109 and semiconductor material 101, and high-k oxide 107 and second insulating material 109 are different materials (e.g., hafnium oxide and silicon oxide, respectively). In the illustrated example high-k oxide 107 is disposed in contact with backside 153 of semiconductor material 101. In one example, first insulating material 103 and second insulating material 109 have the same chemical composition (e.g., silicon oxide). Also shown are protective layers 119/121 disposed on either side of metal grid 117, and metal grid 117 is disposed between protective layer 119 and second insulating material 109. Disposed on protective layer 119 is antireflection coating 123 which may be a dielectric material to prevent light from reflecting off the surface of metal grid 117. In one example, the logic circuitry may be disposed underneath, and optically aligned with, the large portion of metal grid 117 on the edge of semiconductor material 101.

In the depicted example, a first metal segment in metal grid 117 extends through both high-k oxide 107 and second insulating material 109. As shown, metal segments other than the first metal segment in metal grid 117 do not extend to semiconductor material 101. In the depicted example, the gaps between metal grid 117 may be filled with a polymer or the like to create a color filter array such as a bayer pattern, EXR pattern, or the like. As shown, at least part of the image light incident on backside 153 of image sensor 100 that is oblique to surface normal of semiconductor material 101, may be reflected by metal grid 117 into the plurality of photodiodes in semiconductor material 101.

FIGS. 2A-2D illustrate a method of image sensor fabrication. The order in which some or all process figures appear in the method should not be deemed limiting. Rather, one of ordinary skill in the art having the benefit of the present disclosure will understand that some of the method may be executed in a variety of orders not illustrated, or even in parallel. Furthermore, the method may omit certain figures in order to avoid obscuring certain aspects. Alternatively, the method may include additional figures that may not be necessary in some embodiments/examples of the disclosure.

Figure 2A:
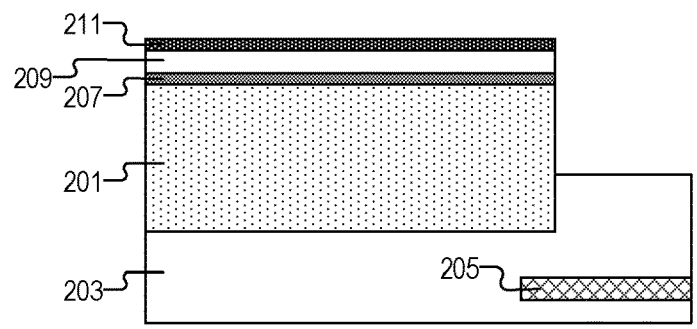
FIGS. 2A-2D illustrate a method of image sensor fabrication, in accordance with the teachings of the present invention.

FIG. 2A shows providing semiconductor material 201 including a plurality of photodiodes disposed in semiconductor material 201. First insulating material 203 is disposed on the frontside of semiconductor material 201, and second insulating material 209 is disposed on the backside of semiconductor material 201. First insulating material 203 includes interconnect 205 disposed proximate to the frontside of semiconductor material 201. As shown high-k oxide 207 and silicon nitride layer 211 may also be disposed proximate the backside of the image sensor. High-k oxide 207 and silicon nitride layer 211 and second insulating may be deposited via chemical vapor deposition, or the like. Any of these layers may be chemically mechanically polished post deposition to ensure a smooth surface and conformal growth of other material layers in subsequent processing steps.

Figure 2B:
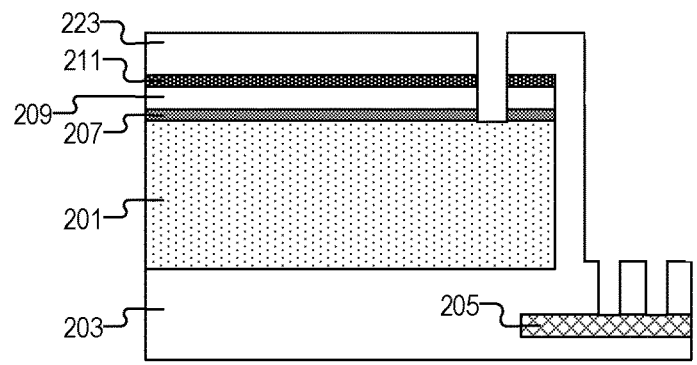

FIG. 2B depicts etching a first trench in first insulating material 203 to contact the interconnect 205 and etching a second trench in second insulating material 209 to contact semiconductor material 201. As shown, etching the second trench includes etching through high-k oxide 207, disposed between second insulating material 209 and semiconductor material 201, and etching through silicon nitride layer 211, where second insulating material 209 is disposed between silicon nitride layer 211 and high-k oxide 207. In some examples, third insulating material 223 (e.g., a buffer oxide) may be disposed over silicon nitride layer 211 such that silicon nitride layer 211 is disposed between second insulating material 209 and third insulating material 223. The first trench may be etched through third insulating material 223 as well. One of ordinary skill in the art will appreciate that the patterning of the trenches may be achieved with either a positive or negative photoresist, and etching may either be wet or dry depending on the specific trench geometry desired.

Figure 2C:
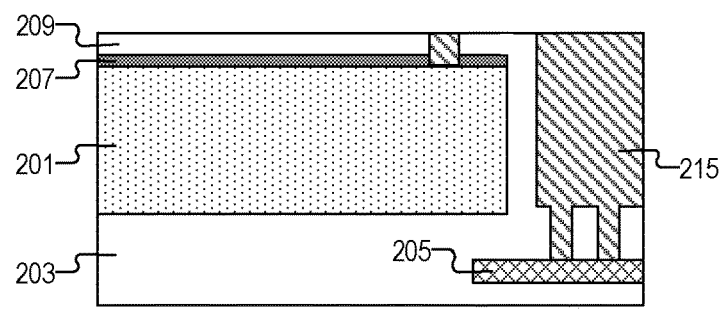

FIG. 2C illustrates depositing a first metal in the first trench (to form metal pad 215) and the second trench. As depicted, metal pad 215 may be disposed proximate to a lateral edge of semiconductor material 201 and may be deposited via thermal evaporation. Moreover after deposition of metal pad 215, the surface of the device may be chemically mechanically polished. As shown, metal pad 215 may be in the periphery of the semiconductor device so that wire bonds or the like can be connected to the semiconductor device. As shown metal pad 215 may have a wider portion disposed proximate to the backside of semiconductor material 201, and may have one or more narrower connection regions which extend from the larger portion through first insulating material 203 to contact interconnect 205. In the depicted example there are two connecting portions but in other examples there may be any number depending on the specific device geometry desired.

Figure 2D:
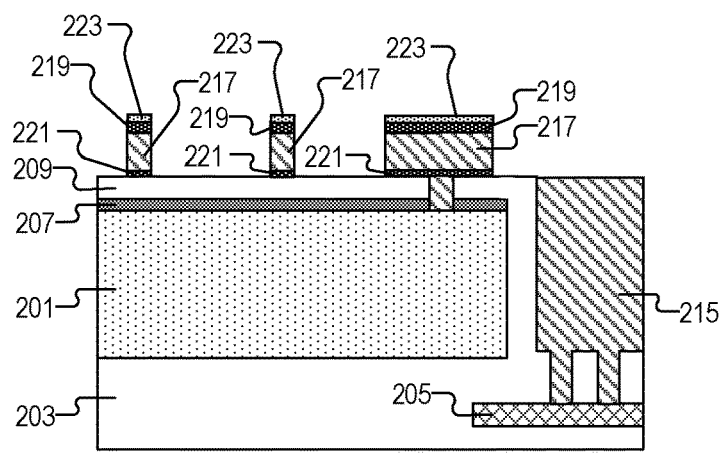

FIG. 2D shows depositing a second metal proximate to the backside of the device so that semiconductor material 201 is disposed between the second metal and first insulating material 203. FIG. 2D also illustrates removing a portion of the second metal to form metal grid 217 proximate to the backside of the semiconductor material 201. This may be achieved by etching the metal away using any of the processes detailed above. As shown, part of the first metal in the second trench extends to metal grid 217 with protective layer 221 disposed between. In some examples, metal grid 217 may be a divider for a color filter array and may be an optical reflector to prevent cross talk between neighboring pixels. In one example, the first metal and the second metal include the same chemical composition (e.g., aluminum or an alloy), and first insulating material 203 and second insulating material 209 include the same chemical composition (e.g., silicon oxide or the like).

FIG. 2D also shows depositing a protective layer 219 disposed on metal grid 217, thus metal grid 217 is disposed between protective layer 219 and protective layer 221. In one example, protective layers 219/221 may include titanium and/or nitrogen. Also shown is antireflection coating 223 deposited on protective layer 219. Antireflection coating 123 may be deposited via CVD or the like.

Figure 3:
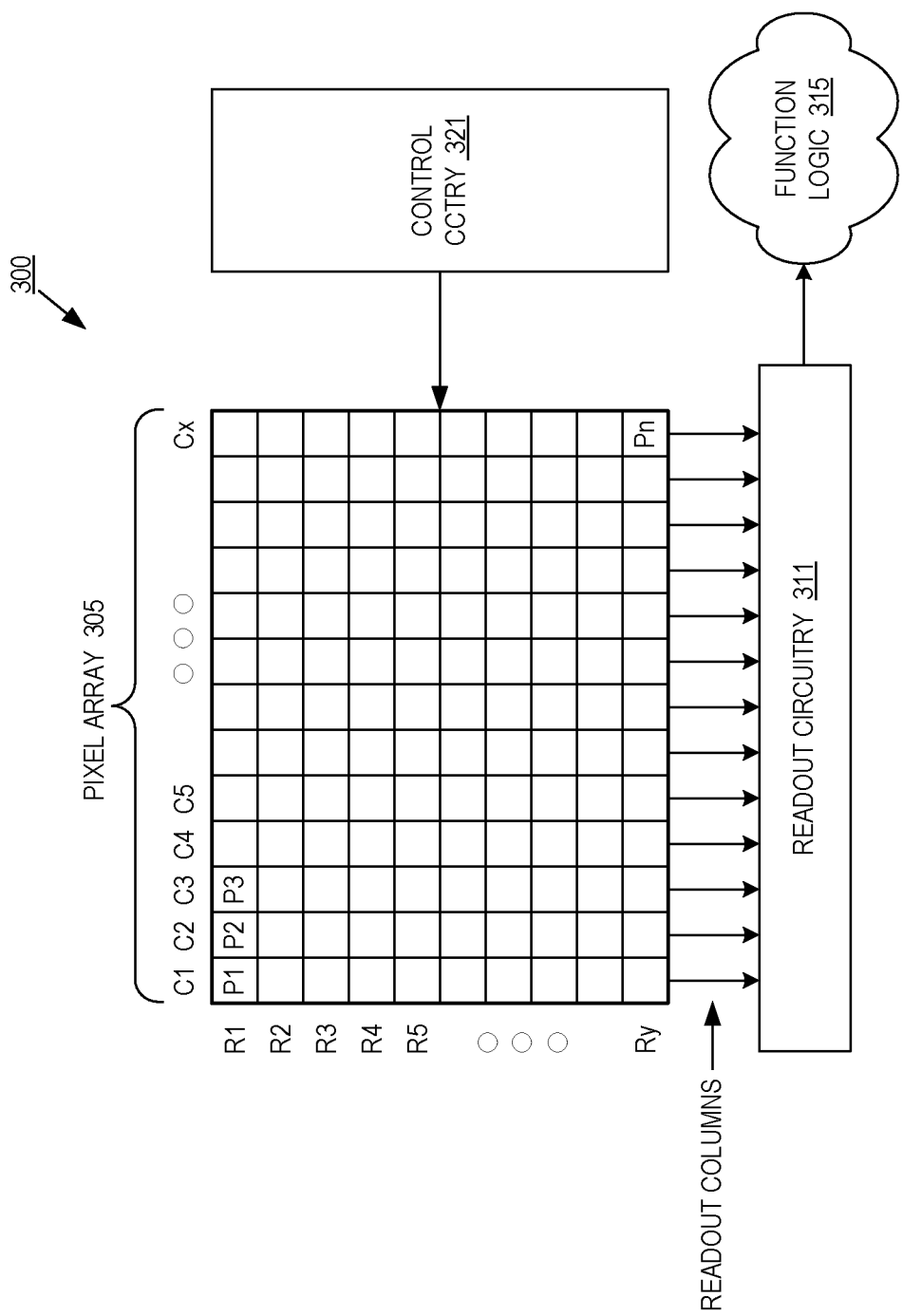
FIG. 3 is a block diagram illustrating one example of an imaging system which may include the image sensor of FIG. 1, in accordance with the teachings of the present invention.

FIG. 3 is a block diagram illustrating one example of an imaging system 300 which may include the image sensor of FIG. 1. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog-to-digital (ADC) conversion circuitry, or otherwise. Function logic 315 may simply store the image data or even manipulate the image data by applying post image effects (e.g., crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously. In one example, the metal pad and interconnects depicted in FIG. 1 and FIGS. 2C-2D are included in readout circuitry 311.

In one example, control circuitry 321 is coupled to pixel array 305 to control operation of the plurality of photodiodes in pixel array 305. For example, control circuitry 321 may generate a shutter signal for controlling image acquisition. In the depicted example, the shutter signal is a global shutter signal for simultaneously enabling all pixels within pixel array 305 to simultaneously capture their respective image data during a single acquisition window. In one example, the metal pad and interconnects depicted in FIG. 1 and FIGS. 2C-2D are included in control circuitry 321. In another example, image acquisition is synchronized with lighting effects such as a flash.

In one example, imaging system 300 may be included in a digital camera, cell phone, laptop computer, automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a semiconductor material including a plurality of photodiodes disposed in the semiconductor material;
a first insulating material disposed proximate to a frontside of the semiconductor material;
an interconnect disposed in the first insulating material proximate to the frontside of the semiconductor material;
a metal pad extending from a backside of the semiconductor material through the first insulating material and contacting the interconnect, wherein the backside is opposite the frontside; and
a metal grid disposed proximate to the backside of the semiconductor material, wherein the semiconductor material is disposed between the metal grid and the first insulating material disposed proximate to the frontside, and wherein gaps in the metal grid are positioned to receive individual color filters in a color filter array so that the metal grid is disposed between the individual color filters, wherein part of image light incident on the backside of the image sensor, and oblique to a surface normal to the semiconductor material, is reflected by the metal grid into the plurality of photodiodes;
wherein a second insulating material and a high-k oxide are disposed between the semiconductor material and the metal grid on the backside of the image sensor, wherein the high-k oxide is disposed between the second insulating material and the semiconductor material, and wherein the high-k oxide and the second insulating material are different materials.

2. The image sensor of claim 1, further comprising a protective layer disposed on the metal grid, wherein the metal grid is disposed between the protective layer and the second insulating material.

3. The image sensor of claim 2, wherein a first metal segment in the metal grid extends through the high-k oxide and the second insulating material to contact the semiconductor material.

4. The image sensor of claim 3, wherein metal segments other than the first metal segment in the metal grid are isolated from the semiconductor material.

5. The image sensor of claim 4, wherein the first insulating material and the second insulating material have a same chemical composition.

6. The image sensor of claim 2, wherein the protective layer includes titanium, and wherein the protective layer has lateral boundaries that are the same as the metal grid.

7. The image sensor of claim 6, further comprising an antireflection coating disposed only on the protective layer so that the protective layer is disposed between the antireflection coating and the metal grid.

8. The image sensor of claim 7, wherein the antireflection coating is a dielectric material disposed on the protective layer to prevent light from reflecting off of a surface of the metal grid.

9. The image sensor of claim 1, wherein the metal pad includes aluminum and the interconnect includes copper.

10. The image sensor of claim 1, wherein one or more trenches extend through the first insulating material to connect the metal pad to the interconnect.

11. The image sensor of claim 1, wherein a majority of the metal pad is disposed proximate to a planar edge of the semiconductor material.

12. The image sensor of claim 1, wherein the metal grid and the metal pad include a same metal.

13. The image sensor of claim 12, wherein the metal grid and the metal pad include aluminum.

14. The image sensor of claim 1, wherein the metal grid is structured to prevent crosstalk between individual photodiodes in the plurality of photodiodes.

15. The image sensor of claim 1, wherein the high-k oxide includes hafnium oxide.

16. The image sensor of claim 1, further comprising a TiN liner in contact with, and disposed between, the metal pad and the first insulating material.

17. An image sensor, comprising:
a semiconductor material including a plurality of photodiodes disposed in the semiconductor material;
a first insulating material disposed proximate to a frontside of the semiconductor material;
an interconnect disposed in the first insulating material proximate to the frontside of the semiconductor material;
a metal pad extending from a backside of the semiconductor material through the first insulating material and contacting the interconnect, wherein the backside is opposite the frontside;

a metal grid disposed proximate to the backside of the semiconductor material, wherein the semiconductor material is disposed between the metal grid and the first insulating material disposed proximate to the frontside, and wherein gaps in the metal grid are positioned to receive individual color filters in a color filter array so that the metal grid is disposed between the individual color filters, wherein part of image light incident on the backside of the image sensor, and oblique to a surface normal to the semiconductor material, is reflected by the metal grid into the plurality of photodiodes; and logic circuitry disposed underneath, and optically aligned with, a portion of the metal grid disposed proximate to an edge of the semiconductor material.

\* \* \* \* \*